(12) United States Patent
Kuroda

(10) Patent No.: US 8,704,147 B2
(45) Date of Patent: Apr. 22, 2014

(54) PHOTOELECTRIC CONVERSION DEVICE

(75) Inventor: Yukihiro Kuroda, Kunitachi (JP)

(73) Assignee: Canon Kabushiki Kaisha, Tokyo (JP)

( * ) Notice: Subject to any disclaimer, the term of this patent is extended or adjusted under 35 U.S.C. 154(b) by 258 days.

(21) Appl. No.: 13/249,764

(22) Filed: Sep. 30, 2011

(65) Prior Publication Data

US 2012/0091322 A1    Apr. 19, 2012

(30) Foreign Application Priority Data

Oct. 14, 2010    (JP) ................................. 2010-231533

(51) Int. Cl.
- *H03F 3/08*    (2006.01)
- *H01J 40/14*   (2006.01)
- *H01L 27/144*  (2006.01)
- *H01L 31/02*   (2006.01)

(52) U.S. Cl.
USPC .................... 250/214 A; 250/214 L; 330/300

(58) Field of Classification Search
USPC .................. 250/208.1, 214 A, 214 L, 214 R; 348/294, 300, 301, 302, 308, 216.1, 348/228.1, 229.1; 257/565, 578, 579, 290, 257/291, 292, 431, 443; 330/299, 300
See application file for complete search history.

(56) References Cited

U.S. PATENT DOCUMENTS

| | | | | |
|---|---|---|---|---|
| 4,065,668 A * | 12/1977 | Monticelli | ................ | 250/214 P |
| 4,585,962 A * | 4/1986 | Sasayama | ..................... | 327/432 |
| 4,973,833 A * | 11/1990 | Takada et al. | ............... | 250/208.1 |
| 5,136,192 A * | 8/1992 | Kooijman | ..................... | 327/350 |
| 5,164,682 A * | 11/1992 | Taralp | .......................... | 330/292 |
| 5,231,345 A * | 7/1993 | Katakura et al. | ............. | 324/73.1 |
| 5,789,738 A * | 8/1998 | Reime | ........................ | 250/214 R |
| 6,642,500 B2 * | 11/2003 | Takahashi | ................. | 250/214 L |
| 6,677,570 B1 * | 1/2004 | McDaniel et al. | ........ | 250/214 A |
| 6,731,488 B2 * | 5/2004 | Voldman | ....................... | 361/111 |
| 6,831,344 B2 * | 12/2004 | Ogawa et al. | ................. | 257/458 |
| 7,196,311 B2 * | 3/2007 | Takiba et al. | ............. | 250/214 R |
| 7,214,922 B2 * | 5/2007 | Takiba et al. | .............. | 250/208.4 |
| 7,592,869 B2 * | 9/2009 | Bae et al. | ....................... | 330/254 |

(Continued)

FOREIGN PATENT DOCUMENTS

| | | |
|---|---|---|
| CN | 1700745 | 11/2005 |
| CN | 101800861 | 8/2010 |
| CN | 101809745 | 8/2010 |
| JP | 2000-077644 | 3/2000 |

OTHER PUBLICATIONS

Office Action issued on Jan. 6, 2014 in counterpart Chinese (PRC) patent application 201110310637.7, with translation.

*Primary Examiner* — John Lee
(74) *Attorney, Agent, or Firm* — Fitzpatrick, Cella, Harper & Scinto

(57) ABSTRACT

A photoelectric conversion device has a first photoelectric converter which converts light into a current, a second photoelectric converter which converts light into a current, a first bipolar transistor which amplifies the current input to a base thereof from the first photoelectric converter, and outputs the amplified current from each of a plurality of emitters thereof, a second bipolar transistor which amplifies the current input to a base thereof from the second photoelectric converter, and outputs the amplified current from each of a plurality of emitters thereof, and a current adder which adds the current from one emitter of the plurality of emitters of the first bipolar transistor, and the current from one emitter of the plurality of emitters of the second bipolar transistor, thereby obtaining a sum current.

7 Claims, 8 Drawing Sheets

(56) References Cited

U.S. PATENT DOCUMENTS

| | | | |
|---|---|---|---|
| 8,106,346 B2* | 1/2012 | Hirose et al. | 250/214 DC |
| 2001/0028027 A1* | 10/2001 | Takahashi | 250/214 L |
| 2003/0150977 A1* | 8/2003 | Yamazaki et al. | 250/214.1 |
| 2005/0051704 A1* | 3/2005 | Kashiura et al. | 250/214 A |
| 2005/0259167 A1 | 11/2005 | Inoue et al. | 348/300 |
| 2010/0134648 A1 | 6/2010 | Funatsu et al. | 348/222.1 |
| 2010/0182465 A1 | 7/2010 | Okita | 348/273 |
| 2010/0194946 A1 | 8/2010 | Shinohara et al. | 348/300 |
| 2011/0181359 A1* | 7/2011 | Balboni | 330/261 |
| 2012/0091322 A1* | 4/2012 | Kuroda | 250/214 A |
| 2012/0175503 A1* | 7/2012 | Kuroda et al. | 250/214 A |
| 2012/0193690 A1* | 8/2012 | Inoue et al. | 257/290 |

\* cited by examiner

F I G. 1
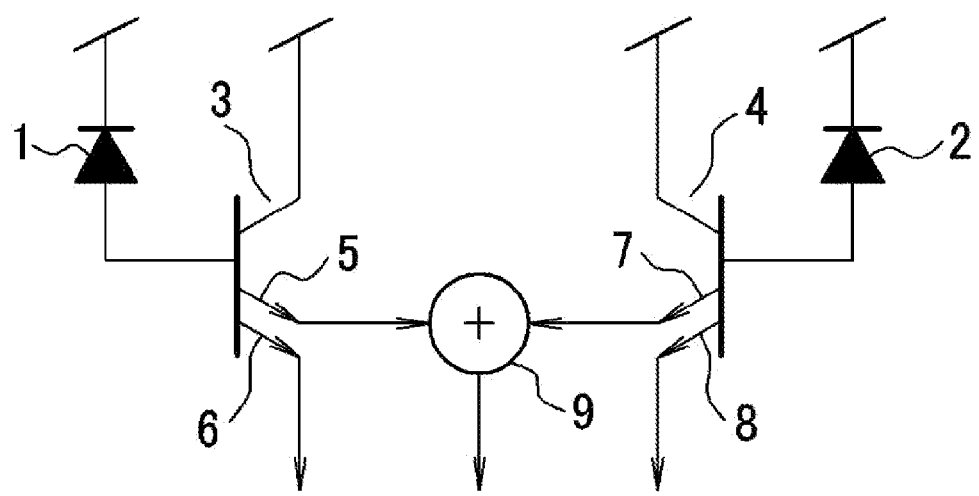

F I G. 4
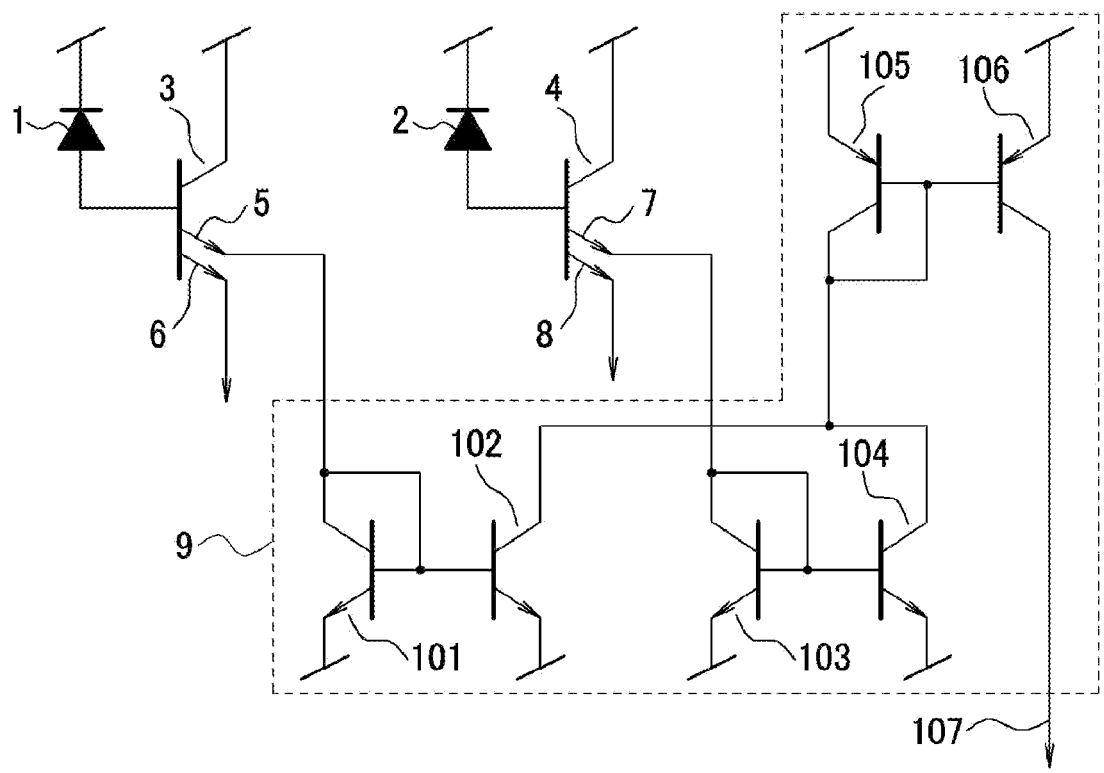
F I G. 5
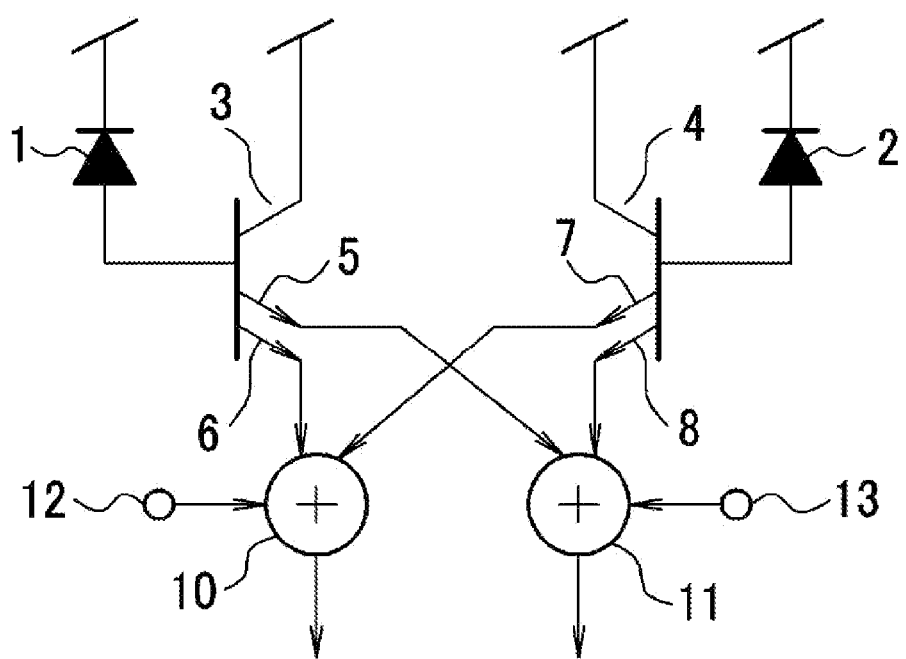

PHOTOELECTRIC CONVERSION DEVICE

BACKGROUND OF THE INVENTION

1. Field of the Invention

The present invention relates to a photoelectric conversion device.

2. Description of the Related Art

To improve the quality of images captured by cameras such as a digital camera and a digital video camera, a photoelectric conversion device needs to widen the light detecting range at low illuminance. A photoelectric conversion device that inputs a current generated by a photoelectric converter to the base of a transistor, and outputs an amplified current from the emitter of the transistor has been disclosed (see Japanese Patent Laid-Open No. 2000-077644).

The light detecting range of the photoelectric conversion device described in Japanese Patent Laid-Open No. 2000-077644 is determined depending on the current generated per unit time, and the range in which a signal processing circuit in a subsequent stage can detect a signal. As a method of widening the light detection range, a method of reducing the current generated per unit time is available. Unfortunately, in this case, while the high-illuminance light detecting range widens, the low-illuminance light detecting range narrows because the latter range is limited by the range in which the signal processing circuit in a subsequent stage can detect a minute signal.

SUMMARY OF THE INVENTION

The present invention provides a photoelectric conversion device advantageous in widening the high-illuminance light detecting range without narrowing the low-illuminance light detecting range.

The first aspect of the present invention provides a photoelectric conversion device comprising a first photoelectric converter which converts light into a current, a second photoelectric converter which converts light into a current, a first bipolar transistor which amplifies the current input to a base thereof from the first photoelectric converter, and outputs the amplified current from each of a plurality of emitters thereof, a second bipolar transistor which amplifies the current input to a base thereof from the second photoelectric converter, and outputs the amplified current from each of a plurality of emitters thereof, and a current adder which adds the current from one emitter of the plurality of emitters of the first bipolar transistor, and the current from one emitter of the plurality of emitters of the second bipolar transistor, thereby obtaining a sum current.

Further features of the present invention will become apparent from the following description of exemplary embodiments with reference to the attached drawings.

BRIEF DESCRIPTION OF THE DRAWINGS

FIG. 1 is a schematic circuit diagram showing a photoelectric conversion device according to the first embodiment of the present invention;

FIG. 4 is a circuit diagram showing the photoelectric conversion device according to the first embodiment of the present invention;

FIG. 5 is a schematic circuit diagram showing a photoelectric conversion device according to the second embodiment of the present invention;

DESCRIPTION OF THE EMBODIMENTS (First Embodiment)

Figure 2:
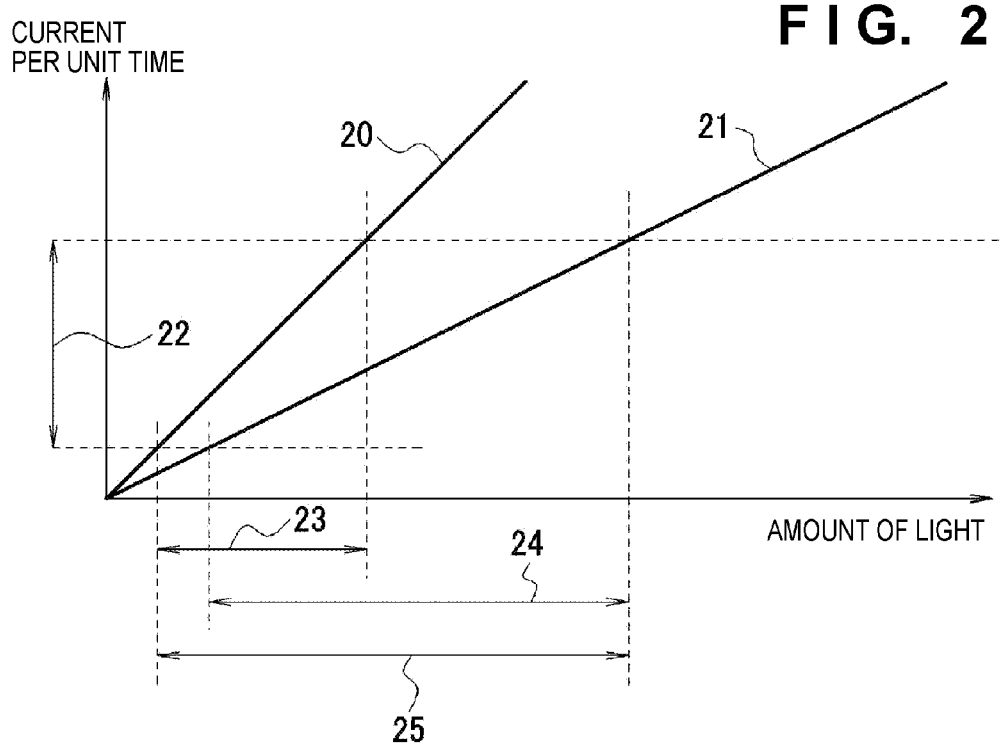
FIG. 2 is a graph for explaining the light detecting range according to the first embodiment of the present invention.

FIG. 1 is a schematic circuit diagram that shows photoelectric conversion device according to the first embodiment of the present invention. The photoelectric conversion device includes a first photoelectric converter 1, second photoelectric converter 2, first current amplifier (first bipolar transistor) 3, second current amplifier (second bipolar transistor) 4, and current adder 9. The first current amplifier 3 can use a first npn bipolar transistor, which has its base connected to the first photoelectric converter 1. The second current amplifier 4 can use a second npn bipolar transistor, which has its base connected to the second photoelectric converter 2. The first current amplifier 3 uses a multi-emitter including a plurality of emitters 5 and 6. The second current amplifier 4 also uses a multi-emitter including a plurality of emitters 7 and 8. The first photoelectric converter 1 is, for example, a photodiode, which has its cathode connected to a power supply potential node, and its anode connected to the base of the first current amplifier 3. The first current amplifier 3 has its collector connected to a power supply potential node. The second photoelectric converter 2 is, for example, a photodiode, which has its cathode connected to a power supply potential node, and its anode connected to the base of the second current amplifier 4. The second current amplifier 4 has its collector connected to a power supply potential node. The photoelectric converters 1 and 2 photoelectrically convert light into currents. The first current amplifier 3 amplifies the current input to its base from the first photoelectric converter 1, and outputs the amplified current from each of the plurality of emitters 5 and 6. The second current amplifier 4 amplifies the current input to its base from the second photoelectric converter 2, and outputs the amplified current from each of the plurality of emitters 7 and 8. The current adder 9 adds the current from one emitter 5 of the first current amplifier 3 and that from one emitter 7 of the second current amplifier 4, and outputs the obtained sum current. The other emitter 6 of the second current amplifier 4 outputs the amplified current, the other emitter 8 of the second current amplifier 4 outputs the amplified current, and simultaneously, the current adder 9 outputs the obtained sum current.

FIG. 2 is a graph showing the relationship between the amount of light and the current per unit time when the ratio between the currents output from a set of emitters 5 and 6 or a set of emitters 7 and 8 is 1:1. Reference numeral 20 denotes a function describing the relationship between the amount of light and the current in Japanese Patent Laid-Open No. 2000-077644; and 21, a function describing the relationship between the amount of light and the current output from the emitter 6 or 8. Reference numeral 22 denotes the range of the current that can be detected by a signal processing circuit in a subsequent stage. The upper limit of the current 22 is limited by circuit current saturation, and its lower current limit is limited by circuit noise. Reference numeral 23 denotes the light detecting range in Japanese Patent Laid-Open No. 2000-077644; and 24, the light detecting range defined by the current obtained by the emitter 6 or 8. The high-illuminance light detecting range defined by the current obtained by the emitter 6 or 8 can be widened by reducing the current per unit time. Moreover, the sum current output from the current adder 9 is equal to that expressed by the function 20. Therefore, the photoelectric conversion device shown in FIG. 1 has a light detecting range 25, so the high-illuminance light detecting range can be widened without narrowing the low-illuminance light detecting range.

Figure 3:
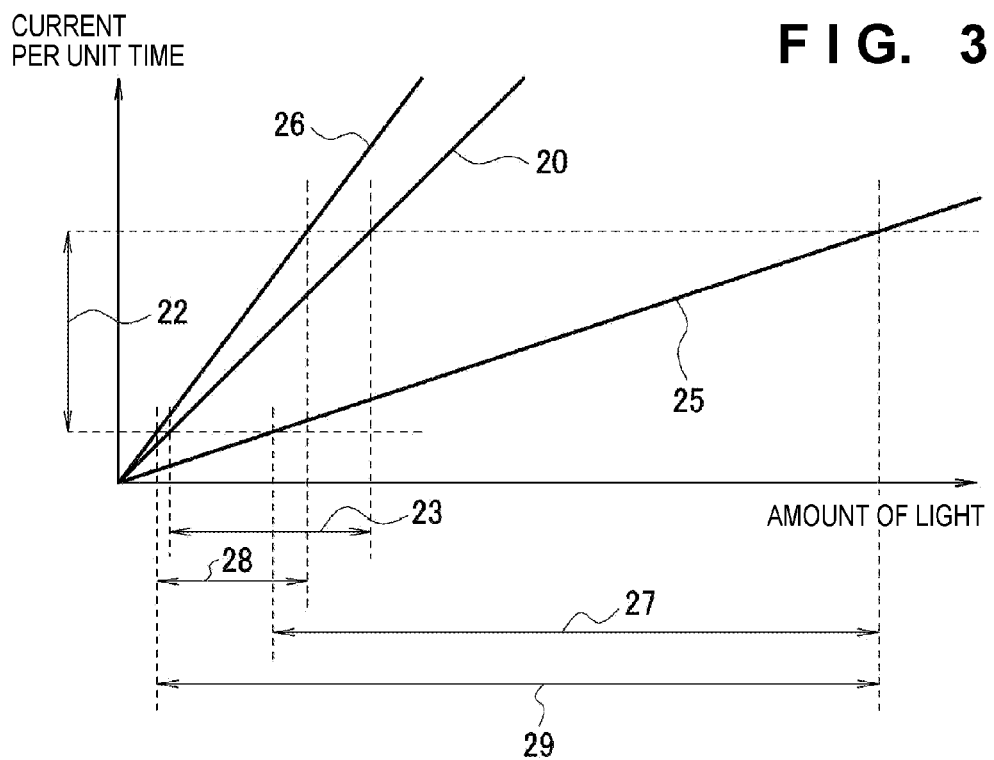
FIG. 3 is a graph for explaining the light detecting range according to the first embodiment of the present invention.

FIG. 3 is a graph showing the relationship between the amount of light and the current per unit time when the ratio between the currents output from a set of emitters 5 and 6 and a set of emitters 7 and 8 is 1:2. Reference numerals 20, 22, and 23 denote the same features as in FIG. 2. Reference numeral 25 denotes a function describing the relationship between the amount of light and the current output from the emitter 6 or 8; and 27, the light detecting range corresponding to that denoted by reference numeral 22. Moreover, reference numeral 26 denotes a function describing the relationship between the amount of light and the current output from the current adder 9; and 28, the light detecting range corresponding to that denoted by reference numeral 22. Therefore, the photoelectric conversion device shown in FIG. 1 has a light detecting range 29, so the high- and low-illuminance light detecting ranges can be widened by changing the ratio between the currents output from a set of emitters 5 and 6 or a set of emitters 7 and 8.

FIG. 4 illustrates an example of the detailed circuit of the current adder 9. Referring to FIG. 4, reference numerals 1 to 8 denote the same elements as in FIG. 1. The current adder 9 can include, for example, npn bipolar transistors 101, 102, 103, and 104, and pnp bipolar transistors 105 and 106. The bipolar transistor 101 has its collector and base connected to the emitter 5, and its emitter connected to a reference potential node. The bipolar transistor 102 has its base connected to the emitter 5, its collector connected to that of the bipolar transistor 104, and its emitter connected to a reference potential node. The bipolar transistor 103 has its collector and base connected to the emitter 7, and its emitter connected to a reference potential node. The bipolar transistor 104 has its base connected to the emitter 7. The bipolar transistor 105 has its collector and base connected to the collector of the bipolar transistor 104, and its emitter connected to a reference potential node. The bipolar transistor 106 has its base connected to that of the bipolar transistor 105. Each of a set of bipolar transistors 101 and 102 and a set of bipolar transistors 103 and 104 forms a current mirror circuit. The signals output from the emitters 5 and 7 are added by a current mirror circuit, formed from the bipolar transistors 105 and 106, via the current mirror circuit including the bipolar transistors 101 and 102 and that including the transistors 103 and 104, respectively, and a sum signal is output from a collector 107 of the bipolar transistor 106.

According to the first embodiment shown in FIGS. 1 and 4, a signal from the first photoelectric converter 1 can be obtained by the emitter 6, a signal from the second photoelectric converter 2 can be obtained by the emitter 8, and a sum signal of the signal from the first photoelectric converter 1 and that from the second photoelectric converter 2 can be obtained by the current adder 9. Moreover, signals from the photoelectric converters 1 and 2, and a sum signal of the signal from the first photoelectric converter 1 and that from the second photoelectric converter 2 can be obtained simultaneously. Hence, the sum signal output from the current adder 9 is used at a low illuminance, and the signal output from the emitter 6 or 8 is used at a high illuminance, thereby making it possible to widen the light detecting range of the photoelectric conversion device, compared to Japanese Patent Laid-Open No. 2000-077644.

(Second Embodiment)

FIG. 5 is a schematic circuit diagram showing a photoelectric conversion device according to the second embodiment of the present invention. Referring to FIG. 5, reference numerals 1 to 8 denote the same elements as in FIG. 1. Referring again to FIG. 5, a current adder 10 has a mode in which it adds the currents output from the emitters 6 and 7, and outputs the obtained sum. The current adder 10 also has a mode in which it directly outputs the current output from the emitter 6. The mode of the current adder 10 can be determined by a signal provided to an add controller 12. Similarly, a current adder 11 is connected to the emitters 5 and 8, and has a mode in which it adds the currents from the emitters 5 and 8 and outputs the obtained sum, and that in which it directly outputs the current output from the emitter 7. The mode of the current adder 11 can be determined by a signal provided to an add controller 13.

Figure 6:
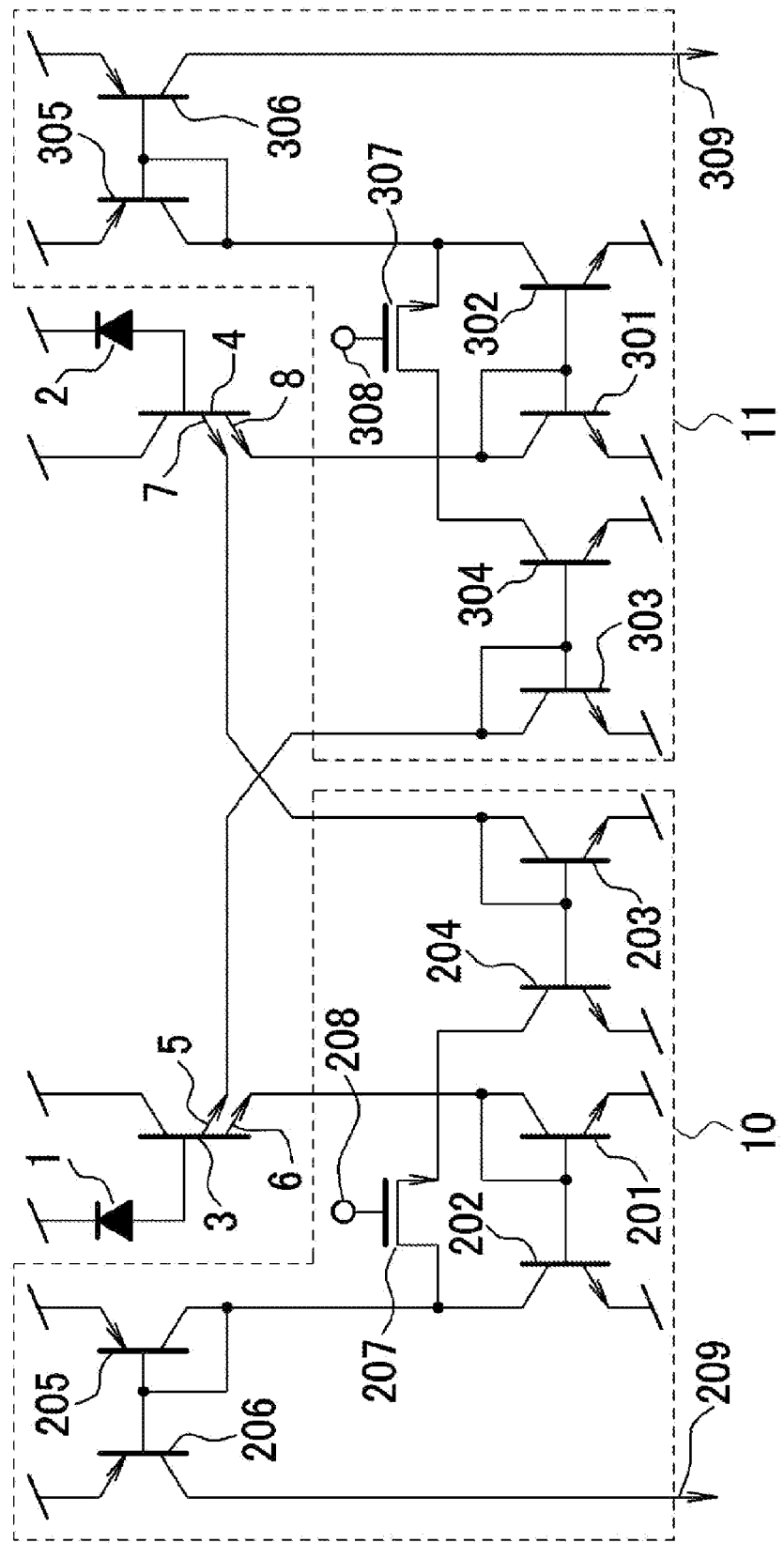
FIG. 6 is a circuit diagram showing the photoelectric conversion device according to the second embodiment of the present invention.

FIG. 6 illustrates an example of the detailed circuit of the current adders 10 and 11. Referring to FIG. 6, reference numerals 1 to 8 denote the same elements as in FIG. 5. Referring again to FIG. 6, the current adder 10 includes bipolar transistors 201 to 206, which have the same arrangements as the bipolar transistors 101 to 106, respectively, shown in FIG. 4. Each of a set of bipolar transistors 201 and 202 and a set of bipolar transistors 203 and 204 forms a current mirror circuit. The signals output from the emitters 6 and 7 are added by a current mirror circuit, formed from the bipolar transistors 205 and 206, via the current mirror circuit including the bipolar transistors 201 and 202 and that including the transistors 203 and 204, respectively, and a sum signal is output from a collector 209 of the bipolar transistor 206. An n-type MOS (Metal Oxide Semiconductor) field-effect transistor 207 forms the add controller 12. The MOS field-effect transistor 207 has its gate connected to a terminal 208, its drain connected to the collector of the bipolar transistor 202, and its source connected to the collector of the bipolar transistor 204. When the voltage of the terminal 208 is at high level, a sum signal of the signal from the emitter 6 and that from the emitter 7 is output to the collector 209. However, when the voltage of the terminal 208 is at low level, a signal input from the emitter 6 is directly output to the collector 209.

Similarly, the current adder 11 includes bipolar transistors 301 to 306, which have the same arrangements as the bipolar transistors 101 to 106, respectively, shown in FIG. 4. An n-type MOS field-effect transistor 307 forms the add controller 13. The MOS field-effect transistor 307 has its gate connected to a terminal 308, its drain connected to the collector of the bipolar transistor 304, and its source connected to the collector of the bipolar transistor 302. When the voltage of the terminal 308 is at high level, a signal from the emitter 5 and that from the emitter 8 are added, and the obtained sum is output to a collector 309 of the bipolar transistor 306. However, when the voltage of the terminal 308 is at low level, a signal input from the emitter 8 is directly output to the collector 309.

The current adder 10 outputs the above-mentioned sum current in response to add designation via the terminal 208, and outputs the current from one emitter 6 of the first current amplifier 3 in response to non-add designation via the terminal 208. Similarly, the current adder 11 outputs the above-mentioned sum current in response to add designation via the terminal 308, and outputs the current from the other emitter 8 of the second current amplifier 4 in response to non-add designation via the terminal 308.

According to the second embodiment shown in FIGS. 5 and 6, by appropriately determining a combination of signals to be provided to the add controllers 12 and 13, signals (non-sum signals) from the photoelectric converters 1 and 2 can be output, or a non-sum signal and a sum signal can simultaneously be output. Hence, a sum signal is used at a low illuminance, and a non-sum signal is used at a high illuminance, thereby making it possible to widen the light detecting range of the photoelectric conversion device, compared to Japanese Patent Laid-Open No. 2000-077644. Further, while signals of three systems are output in the first embodiment, signals of two systems are output in the second embodiment, so the number of signal processing circuits in subsequent stages can be smaller in the latter than in the former, thus allowing a reduction in cost.

(Third Embodiment)

Figure 7:
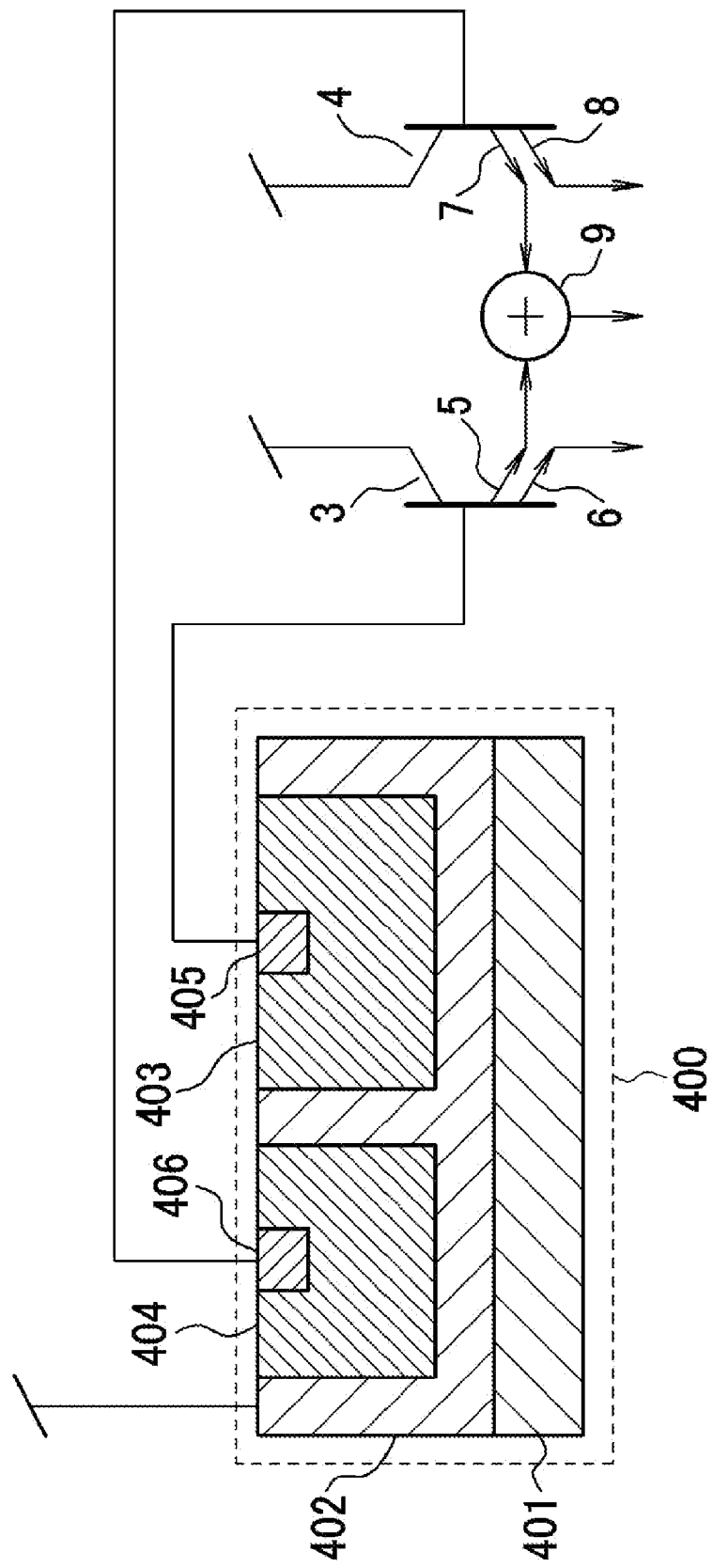
FIG. 7 is a schematic circuit diagram showing a photoelectric conversion device according to the third embodiment of the present invention.

FIG. 7 is a schematic circuit diagram showing a photoelectric conversion device according to the third embodiment of the present invention. Referring to FIG. 7, reference numerals 3 to 9 denote the same elements as in FIG. 1. Referring again to FIG. 7, reference numeral 400 denotes a cross-section of photoelectric converters 1 and 2. An n-type well 402 is formed on a p-type semiconductor substrate 401. The n-type well 402 is connected to a power supply potential node. N-type regions 403 and 404 are formed in the n-type well 402 to have a concentration different from the n-type well 402. P-type regions 405 and 406 are arranged in the n-type regions 403 and 404, respectively, thereby forming pn junction photodiodes which function as the photoelectric converters 1 and 2. The p-type region 405 is connected to the first current amplifier 3, and the p-type region 406 is connected to the second current amplifier 4. Note that the n-type regions 403 and 404 are formed to have different sizes. Hence, the n-type regions 403 and 404 generate different currents by photoelectric conversion, thus functioning as the photoelectric converters 1 and 2 with different sensitivities. The area of the light receiving portion of the first photoelectric converter 1 and that of the second photoelectric converter 2 are different from each other, so they convert light into currents at different sensitivities. As described above, a signal generated by the n-type region 403 is output from the emitter 6, a signal generated by the n-type region 404 is output from the emitter 8, and simultaneously, a sum signal of the signal generated by the n-type region 403 and that generated by the n-type region 404 is output from the current adder 9. This makes it possible to further widen the light detecting range of the photoelectric conversion device, compared to the first and second embodiments.

(Fourth Embodiment)

Figure 8:
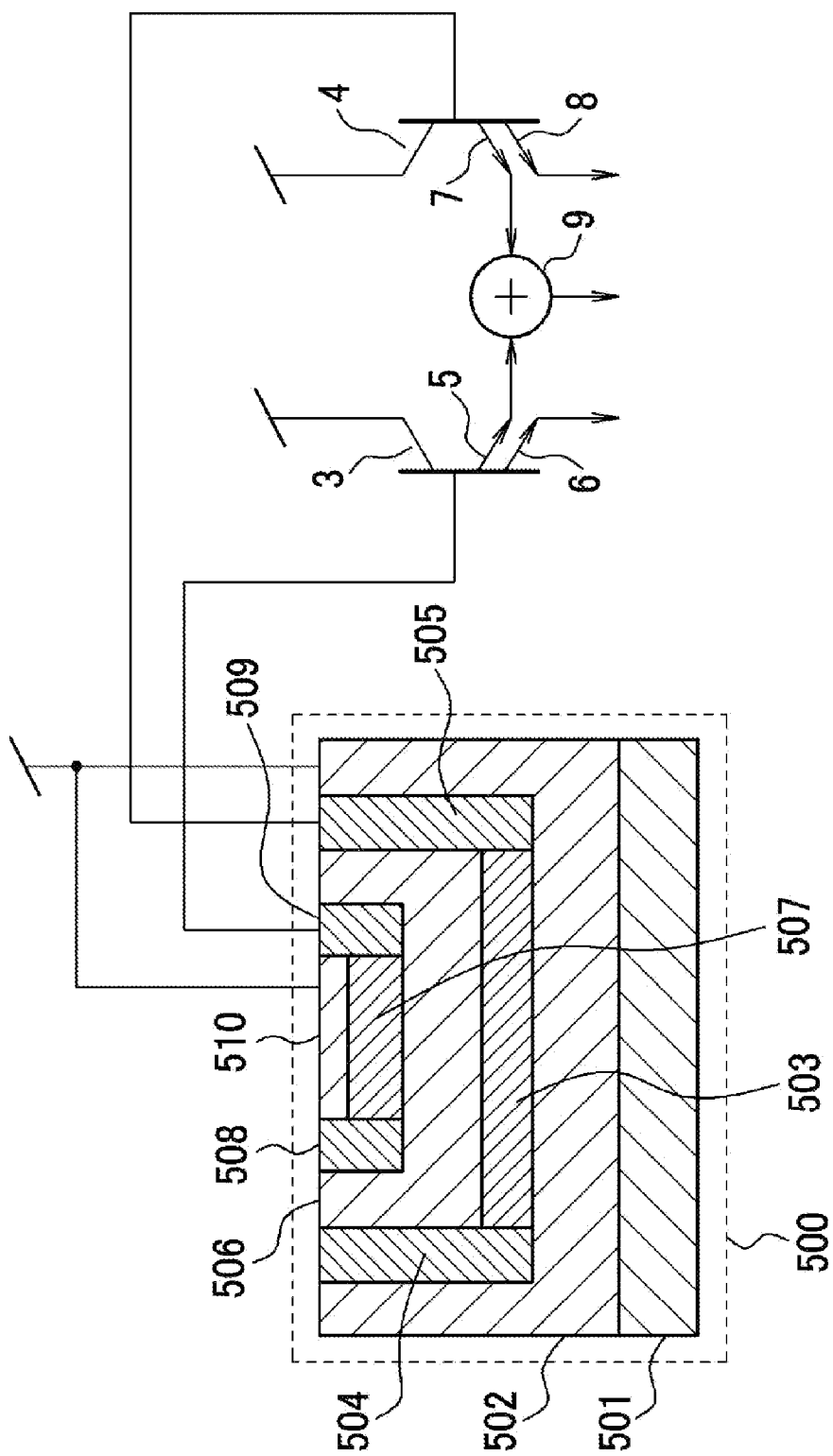
FIG. 8 is a schematic circuit diagram showing a photoelectric conversion device according to the fourth embodiment of the present invention.

FIG. 8 is a schematic circuit diagram showing a photoelectric conversion device according to the fourth embodiment of the present invention. Referring to FIG. 8, reference numerals 3 to 9 denote the same elements as in FIG. 1. Referring again to FIG. 8, reference numeral 500 denotes a cross-section of photoelectric converters 1 and 2. An n-type well 502 is formed on a p-type semiconductor substrate 501. A p-type region 503 is arranged in the n-type well 502, thereby forming a pn junction photodiode which functions as the second photoelectric converter 2. The p-type region 503 is connected to the second current amplifier 4 via $p^+$-type regions 504 and 505. An n-type region 506 is arranged on the p-type region 503. A p-type region 507 is arranged on the n-type region 506, and an n-type region 510 is arranged on the p-type region 507, thereby forming a pn junction photodiode which functions as the first photoelectric converter 1. The p-type region 507 is connected to the first current amplifier 3 via $p^+$-type regions 508 and 509. The n-type well 502 and n-type region 510 are connected to a power supply potential node. Note that the p-type regions 503 and 507 are formed in the p-type semiconductor substrate 501 at different depths, and therefore can obtain signals for light beams in different wavelength bands. The first photoelectric converter 1 and second photoelectric converter 2 are provided in the p-type semiconductor substrate 501 at different depths, and therefore convert light into currents at different sensitivities. As described above, a signal generated by the second photoelectric converter 2 in a deep region, a signal generated by the first photoelectric converter 1 in a shallow region, and a sum signal of the signals generated by the two photoelectric converters 1 and 2 can be obtained by the emitters 8 and 6 and current adder 9, respectively. This makes it possible to further widen the light detecting range of the photoelectric conversion device, compared to the first to third embodiments. In this embodiment, signals from regions with different depths are detected. Hence, at a high illuminance, different color signals can be utilized as white balance information.

(Fifth Embodiment)

Figure 9:
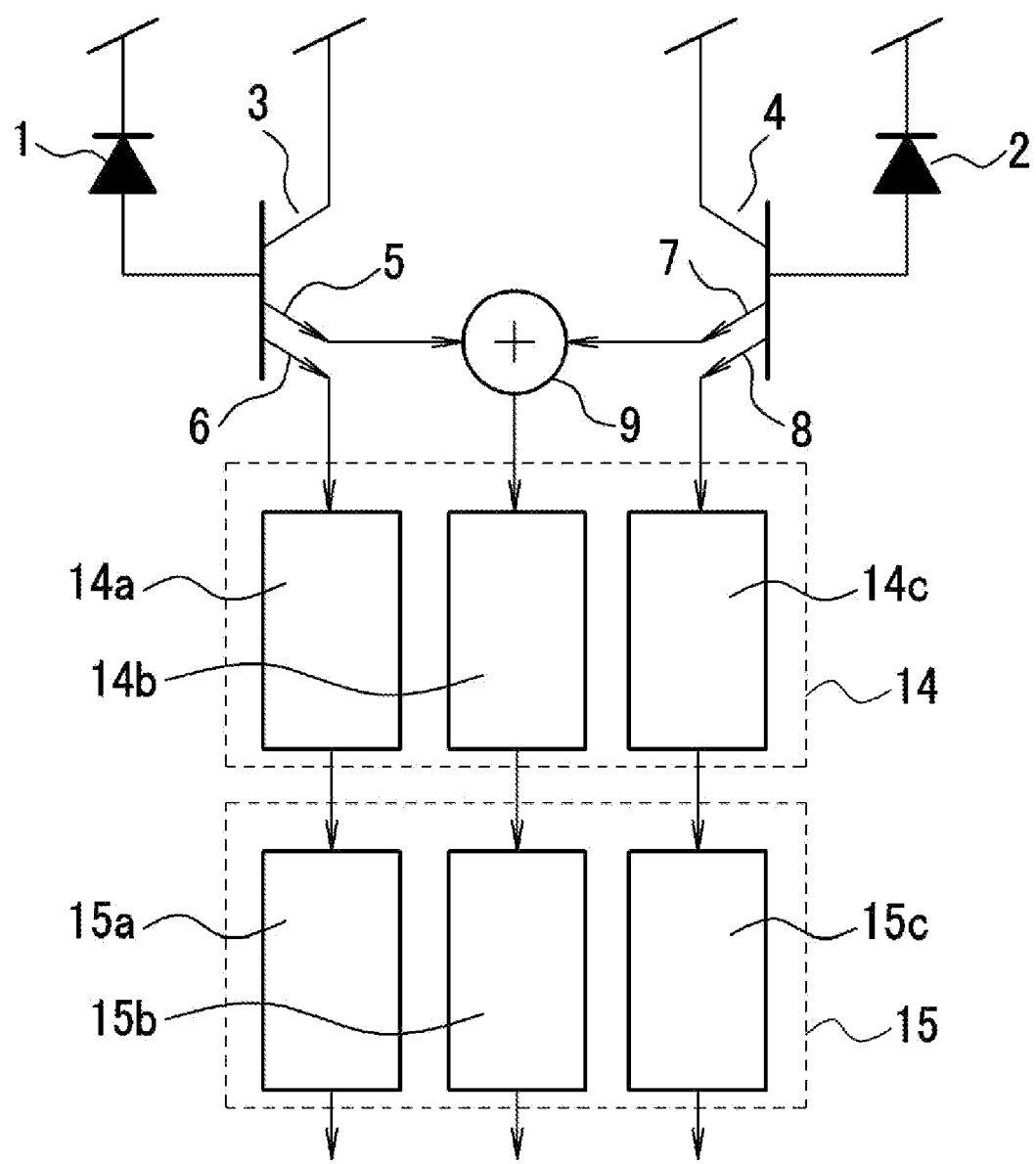
FIG. 9 is a schematic circuit diagram showing a photoelectric conversion device according to the fifth embodiment of the present invention.

FIG. 9 is a schematic circuit diagram showing a photoelectric conversion device according to the fifth embodiment of the present invention. Referring to FIG. 9, reference numerals 1 to 9 denote the same elements as in FIG. 1. The photoelectric conversion device in the fifth embodiment includes a logarithmic-converter 14 and signal accumulator 15. The logarithmic-converter 14 includes logarithmic-conversion circuits 14a, 14b, and 14c. The signal accumulator 15 includes signal accumulation circuits 15a, 15b, and 15c. The logarithmic-conversion circuit 14a logarithmic-converts the current from the emitter 6, and outputs the logarithmic-converted signal to the signal accumulation circuit 15a. The signal accumulation circuit 15a accumulates the signal logarithmic-converted by the logarithmic-conversion circuit 14a. The logarithmic-conversion circuit 14b logarithmic-converts the current output from the current adder 9, and outputs the logarithmic-converted signal to the signal accumulation circuit 15b. The signal accumulation circuit 15b accumulates the signal logarithmic-converted by the logarithmic-conversion circuit 14b. The logarithmic-conversion circuit 14c logarithmic-converts the current from the emitter 8, and outputs the logarithmic-converted signal to the signal accumulation circuit 15c. The signal accumulation circuit 15c accumulates the signal logarithmic-converted by the logarithmic-conversion circuit 14c.

Figure 10:
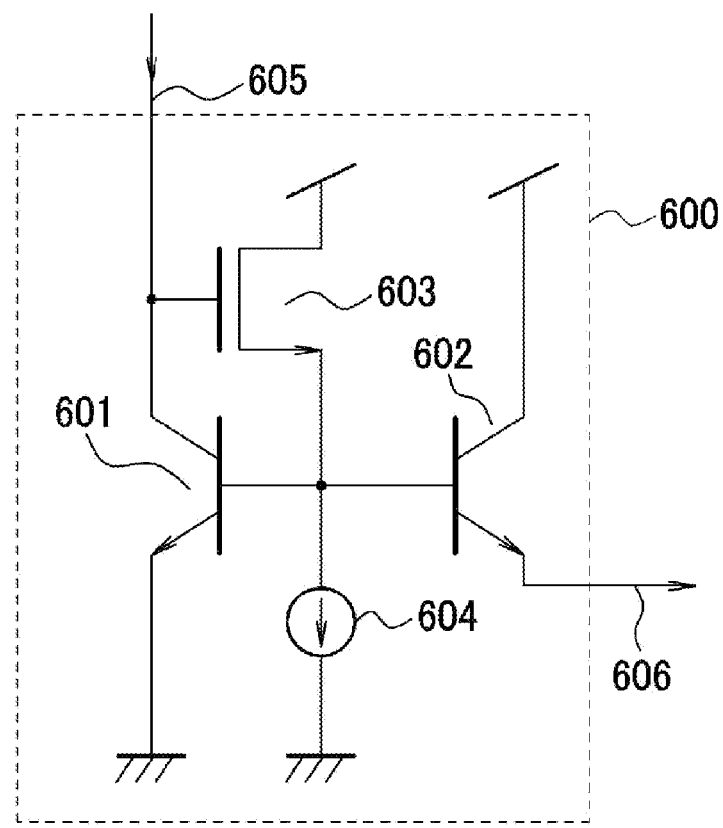
FIG. 10 is a circuit diagram showing a logarithmic compression circuit in the fifth embodiment of the present invention.

FIG. 10 illustrates an example of the detailed circuit of each of the logarithmic-conversion circuits 14a, 14b, and 14c. A logarithmic-conversion circuit 600 corresponds to each of the logarithmic-conversion circuits 14a, 14b, and 14c, and includes transistors 601, 602, and 603, and a constant current source 604. A signal from the first current amplifier 3 or 4 or current adder 9 is input via an input line 605, and a logarithmic-converted signal is output via an output line 606. The logarithmic-conversion circuit 600 logarithmic-converts the signal from the input line 605, and outputs the logarithmic-converted signal to the output line 606.

Figure 11:
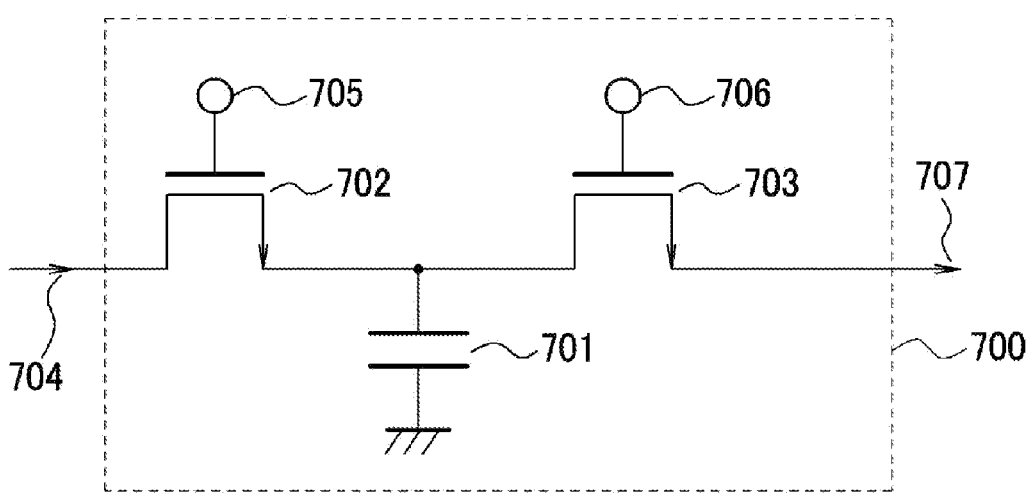
FIG. 11 is a circuit diagram showing a signal accumulation circuit in the fifth embodiment of the present invention.

FIG. 11 illustrates an example of the detailed circuit of each of the signal accumulation circuits 15a, 15b, and 15c. A signal accumulation circuit 700 corresponds to each of the signal accumulation circuits 15a, 15b, and 15c, and includes transistors 702 and 703 and an accumulation capacitance 701. When the transistor 702 is kept ON by controlling the voltage of a terminal 705, a signal 704 output from the logarithmic-conversion circuit 600 is accumulated in the accumulation capacitance 701. Thus, a time accumulation signal of light based on the current generated by the photoelectric converter 1 or 2 is held in the accumulation capacitance 701, and can be extracted as a voltage signal 707 when the transistor 703 is turned on by controlling the voltage of a terminal 706. This embodiment can provide a photoelectric conversion device capable of effectively obtaining a wide light detecting range by logarithmic conversion.

According to the first to fifth embodiments, the sum current obtained by one of the current adders 9 to 11 is used at a low illuminance, and the current from the emitter of each of the first current amplifier 3 and/or second current amplifier 4 is used, thereby making it possible to widen the light detecting range.

Although a case in which signals from the two photoelectric converters 1 and 2 are added by one of the current adders 9, 10, and 11 has been taken as an example in the above-mentioned first to fifth embodiments, the present invention is not limited to this. The same effect can also be obtained when, for example, signals from three or more photoelectric converters are added by a current adder.

Also, although a case in which each of the first current amplifiers 3 and 4 includes two emitters has been taken as an example in the above-mentioned embodiments, the present invention is not limited to this. The same effect can also be obtained when, for example, each current amplifier includes three or more emitters, and the combination of photoelectric converters to be used for addition is changed.

Moreover, although a case in which the current adders 9 to 11 use bipolar transistors has been taken as an example in the above-mentioned embodiments, the same effect can also be obtained when they use MOS field-effect transistors.

Note that all the above-mentioned embodiments merely give examples in which the present invention is actually practiced, and must not be interpreted as limiting the technical scope of the present invention. That is, the present invention can be practiced in various formed without departing from the technical idea or main features of the present invention. The first to fifth embodiments can be combined into various forms.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-231533, filed Oct. 14, 2010, which is hereby incorporated by reference herein in its entirety.

What is claimed is:

1. A photoelectric conversion device comprising:
   a first photoelectric converter which converts light into a current;
   a second photoelectric converter which converts light into a current;
   a first bipolar transistor which amplifies the current input to a base thereof from said first photoelectric converter, and outputs an amplified current from each of a plurality of emitters thereof;
   a second bipolar transistor which amplifies the current input to a base thereof from said second photoelectric converter, and outputs an amplified current from each of a plurality of emitters thereof; and
   an amplified-current adder which adds the amplified current from one emitter of said plurality of emitters of said first bipolar transistor and the amplified current from one emitter of said plurality of emitters of said second bipolar transistor, and obtains a sum current.

2. The device according to claim 1,
   wherein said amplified-current adder adds the amplified current from another of said plurality of emitters of said first bipolar transistor and the amplified current from another of said plurality of emitters of said second bipolar transistor, and outputs a sum current.

3. The device according to claim 1, wherein said amplified-current adder
   outputs the sum current in response to an add designation delivered via a terminal whose voltage is at a high level, and
   outputs the amplified current from said one emitter of said first bipolar transistor or of said second bipolar transistor in response to a non-add designation delivered via a terminal whose voltage is at a low level.

4. The device according to claim 1, wherein said first photoelectric converter and said second photoelectric converter convert light into currents at different sensitivities.

5. The device according to claim 4, wherein an area of a light-receiving portion of said first photoelectric converter and an area of a light-receiving portion of said second photoelectric converter are different from each other.

6. The device according to claim 4, further comprising a semiconductor substrate, wherein said first photoelectric converter and said second photoelectric converter are provided in said semiconductor substrate at different depths.

7. The device according to claim 1, further comprising:
   a logarithmic converter which logarithmically converts the amplified current from another of said plurality of emitters of said first bipolar transistor, the amplified current from another of said plurality of emitters of said second bipolar transistor, and the amplified current output from said amplified-current adder; and
   a signal accumulator which accumulates the signal logarithmically converted by said logarithmic converter.

* * * * *